United States Patent
Bansal et al.

(10) Patent No.: US 7,285,980 B2
(45) Date of Patent: Oct. 23, 2007

(54) METHOD AND APPARATUS FOR MULTIPLEXING AN INTEGRATED CIRCUIT PIN

(75) Inventors: Vishal Bansal, Uttar Pradesh (IN); Deepak Baranwal, Uttar Pradesh (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 59 days.

(21) Appl. No.: 11/190,492

(22) Filed: Jul. 26, 2005

(65) Prior Publication Data

US 2006/0123292 A1 Jun. 8, 2006

(30) Foreign Application Priority Data

Jul. 27, 2004 (IN) .................. 1387/DEL/2004

(51) Int. Cl.
*H03K 19/177* (2006.01)

(52) U.S. Cl. .......................... 326/38; 326/41

(58) Field of Classification Search ............ 326/37–38, 326/41, 47, 101
See application file for complete search history.

(56) References Cited

U.S. PATENT DOCUMENTS

| 5,686,844 A | 11/1997 | Hull et al. | |
|---|---|---|---|
| 6,057,705 A * | 5/2000 | Wojewoda et al. | 326/38 |
| 6,822,474 B2 * | 11/2004 | Chaudhari | 326/16 |

* cited by examiner

*Primary Examiner*—James H. Cho
(74) *Attorney, Agent, or Firm*—Lisa K. Jorgenson; Robert Iannucci; Seed IP Law Group PLLC

(57) ABSTRACT

A system and method for multiplexing an integrated circuit pin include a plurality of registers for storing bit values; a plurality of functions to be multiplexed on receiving the bit values; a decoding logic for decoding the bit values for selecting at least one of the functions; a plurality of pads connected to the plurality of functions and the decoding logic; and external pin/pins acting as inputs/outputs for the selected functionality depending upon the bit values.

20 Claims, 8 Drawing Sheets

| BIT21 | BIT22 | Package Selection | Pad Enabled in package | State | |
|---|---|---|---|---|---|
| | | | | Non-volatile memory bits | Register bits |
| 0 | 0 | Optimized pin package | Reset pad PAD21 enabled GP IO pad PAD22 disabled | Default state when device gets ON | Default state when device gets ON |
| 0 | 1 | Optimized pin package | Reset pad PAD21 disabled GP IO pad PAD22 enabled | Programmed options | After program execution starts |
| 1 | 0 | Normal pin package | Reset pad PAD21 enabled GP IO pad PAD22 enabled | Programmed options | After program execution starts |
| 1 | 1 | Normal pin package | Reset pad PAD21 enabled GP IO pad PAD22 enabled | Programmed options | After program execution starts |

FIG. 4

METHOD AND APPARATUS FOR MULTIPLEXING AN INTEGRATED CIRCUIT PIN

BACKGROUND OF THE INVENTION

1. Field of the Invention

The present invention relates to method and apparatus for multiplexing an integrated circuit pin.

2. Description of the Related Art

In the field of Application Specific Integrated Circuit (ASIC), there are a number of applications, which are yet to be explored. As a result of this, manufacturers of micro processor/controller have found it necessary to design their chips in a way so as to target more than one application (or customer) with a single die and simultaneously reduce the cost of manufacturing, maximize profit and reduce time to market.

Conventional IC devices are designed with dedicated pin configuration, i.e. each pin is dedicated to a specific functionality only. This certainly imposes a problem for IC devices having a low pin count.

U.S. Pat. No. 5,686,844 discloses two embodiments of the same invention that use a memory device to store information to configure the IC device pin. Input/Output logic is also used in both the embodiments in order to transfer data to and from the IC device pin when the IC device pin is configured as a digital I/O pin.

FIG. 1 shows a system for configuring IC device pins as a block input pin or as a digital I/O pin as described in the above patent. The system 10 may be used for any type of IC device 12 that requires a clock input pin and a digital I/O pin such as a PIC16C5X type micro-controller produced by MICROCHIP TECHNOLOGY, INC.

The system 10 comprises an IC device pin 14. A memory system 16 is provided for storing a value to configure the IC device pin 14 as a clock input pin and for storing a value to configure the IC device pin 14 as a digital I/O pin. The memory system 16 is a nonvolatile memory bit. The memory system 16 may also use a volatile memory bit. However, the volatile memory bit must have a set known value upon power up of the system 10.

Input/Output (I/O) logic 18 is coupled to an output 16B of the memory system 16. The I/O logic 18 is used for writing data out of the IC device pin 14 and for reading data in from the IC device pin 14 when the IC device pin 14 is configured as a digital I/O pin, the data is transferred to and from the I/O logic 18 through a data bus 20 which is directly coupled to the I/O logic 18.

Clock logic gate circuitry 22 is coupled to the output 16B of the memory system 16 and to the IC device pin 14. The clock logic gate circuitry 22 is used for outputting a clock signal when the IC device pin 14 is configured as a clock input pin. The clock logic circuitry is comprised of an AND gate 22A having an input coupled to the output 16B of the memory system 16 and having another input coupled to the IC device pin 14, and an OR gate 22B having an input coupled to an output of the AND gate 22A and another input 23 coupled to other clock sources that may be internal or external to the IC device 12.

The memory system 16 receives program data through its input 16A. The program data will set the IC device pin 14 as a clock input pin or as a digital I/O pin. The program data will either be a high value "1" or a low value "0". When a "1" is inputted to the memory system 16, the IC device pin 14 is configured as a clock input pin. The memory system 16 will output a "1" at its output 16B and the inverter 24 will invert the high signal "1" signal to a low signal "0". The low signal "0" will in turn disable the I/O logic 18. With the I/O logic 18 disabled, when the IC device pin 14 goes high, the output of the AND gate 22A will go high causing the output of the OR gate 22B to go high. Thus, an external clock signal that is coupled to the IC device pin 14 will be outputted through the OR gate 22B to components in the IC device 12 that requires a clock signal to operate. Another input 23 to the OR gate 22B is coupled to other clock source signals. These other clock source signals may be internal or external to the IC device 12. When the IC device pin 14 is configured as a digital I/O pin, the clock logic gate circuitry 22 may still send out a clock signal. However, the clock signal sent from the OR gate 22B has to come from the one of the other clock source signals that may be sent through input 24 of the OR gate 22B. For most IC devices 12 and applications, only one clock source is active.

When a low value "0" is inputted to the memory system 16, the IC device pin 14 is configured as a digital I/O pin. The memory system 16 will output a low signal "0" at its output 16B and the inverter 24 will invert the low signal "0" signal to a high signal "1". The high signal "1" will enable the I/O logic 18.

The US patent as described above explains how to reuse one pin for different functionalities such as reset, clock or general-purpose I/O functionalities. It also describes how to share a single I/O for either reset/clock functionality or general I/O functionality by using a single configuration bit to configure the device into either of the functionalities.

While this idea is very useful in the sense that same die can be marketed as two devices (with Reset/Clock and with I/O functionality), it cannot be used for a normal package where both reset/clock and general I/O are present on dedicated pins. To fulfill this requirement, a different die is required as said patent uses a single I/O pad for this multiplexing. This amounts to again a new product design & testing cycle.

Also, when used for Reset functionality, the pad behaves as an input pin only. This limits the application, as the IC device cannot reset external devices.

Therefore, a need exists to provide a method and system in which the same die can be used for different configurations.

BRIEF SUMMARY OF THE INVENTION

One embodiment of the present invention provides a method and system for multiplexing an integrated circuit pin, which uses the same die with different packaging namely normal pin count and optimized pin count.

One embodiment provides flexibility to the user as the configuration can also be done with programmable bits, which are accessible through application software.

One embodiment of the invention configures the device for specific functionality at the output without internally disabling other functionalities.

One embodiment of the invention uses option/register/mask option bits to allow external pin to switch between two different peripheral functions thus providing better utilization of peripherals and pins in a micro controller.

One embodiment of the invention reduces the time to market and cost thereby increasing profit.

One embodiment of the invention provides a system for multiplexing an integrated circuit pin including:

a plurality of registers for storing bit values;

a plurality of functions to be multiplexed on receiving the bit values;

a decoding logic for decoding the bit values for selecting desired functionalities;

a plurality of pads connected to the plurality of functions and the decoding logic; and external pin/pins acting as inputs/outputs for the selected functionality depending upon said bit values.

The number of the plurality of registers used depends upon the number of functions to be multiplexed.

The bit values used include hardware or software programmed bits.

The plurality of functions exclude Vcc and ground pins of the integrated circuit.

The decoding logic is a combination of logic gates depending upon the number of the functions to enable the pad/pads and functions.

The external pin/pins selection depends upon optimized pin package or normal pin package.

The decoding logic to decide external pin/pins to act as inputs/outputs includes:

a pad containing desired functionality;

a logic connected to said pad and including few logic gates and registers for performing said desired functions;

at least two registers connected to said logic to enable/disable said pad; and a plurality of logic gates connected to said registers; and an AND gate receiving inputs from said registers for providing a signal to said logic to make said external pin/pins to act as inputs/outputs.

A method for multiplexing an integrated circuit pin includes:

storing bit values in a plurality of registers;

multiplexing the plurality of functions on receiving said bit values;

decoding said bit values for selecting desired functionalities in decoding logic;

connecting a plurality of pads to said plurality of functions and said decoding logic; and deciding external pin/pins to act as inputs/outputs for said selected functionality depending upon said bit values.

Therefore, at least one embodiment of the invention provides a method and system in which the same die can be used for different configurations. With different bonding, this can be easily achieved on a single die, thus reducing cost of extra design & testing.

BRIEF DESCRIPTION OF THE SEVERAL VIEWS OF THE DRAWING(S)

The invention will now be described with reference to and as illustrated in the accompanying drawings.

FIG. 4 shows a truth table that gives several options to use a single die in different configurations using two bits.

Figure 5:
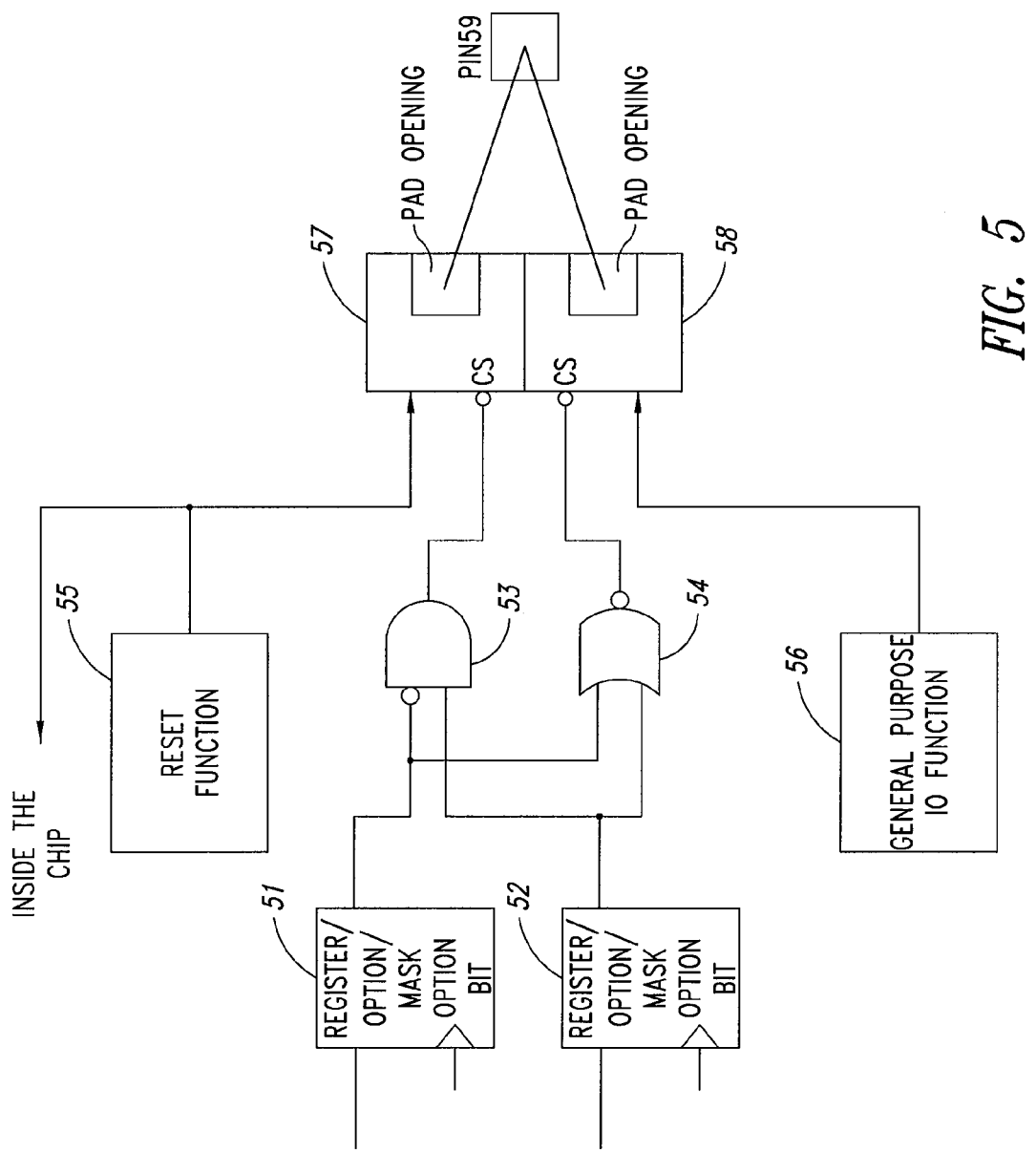

FIG. 5 expands the internal structure of the die for two-bit implementation in accordance with one embodiment of the invention.

Figure 6:
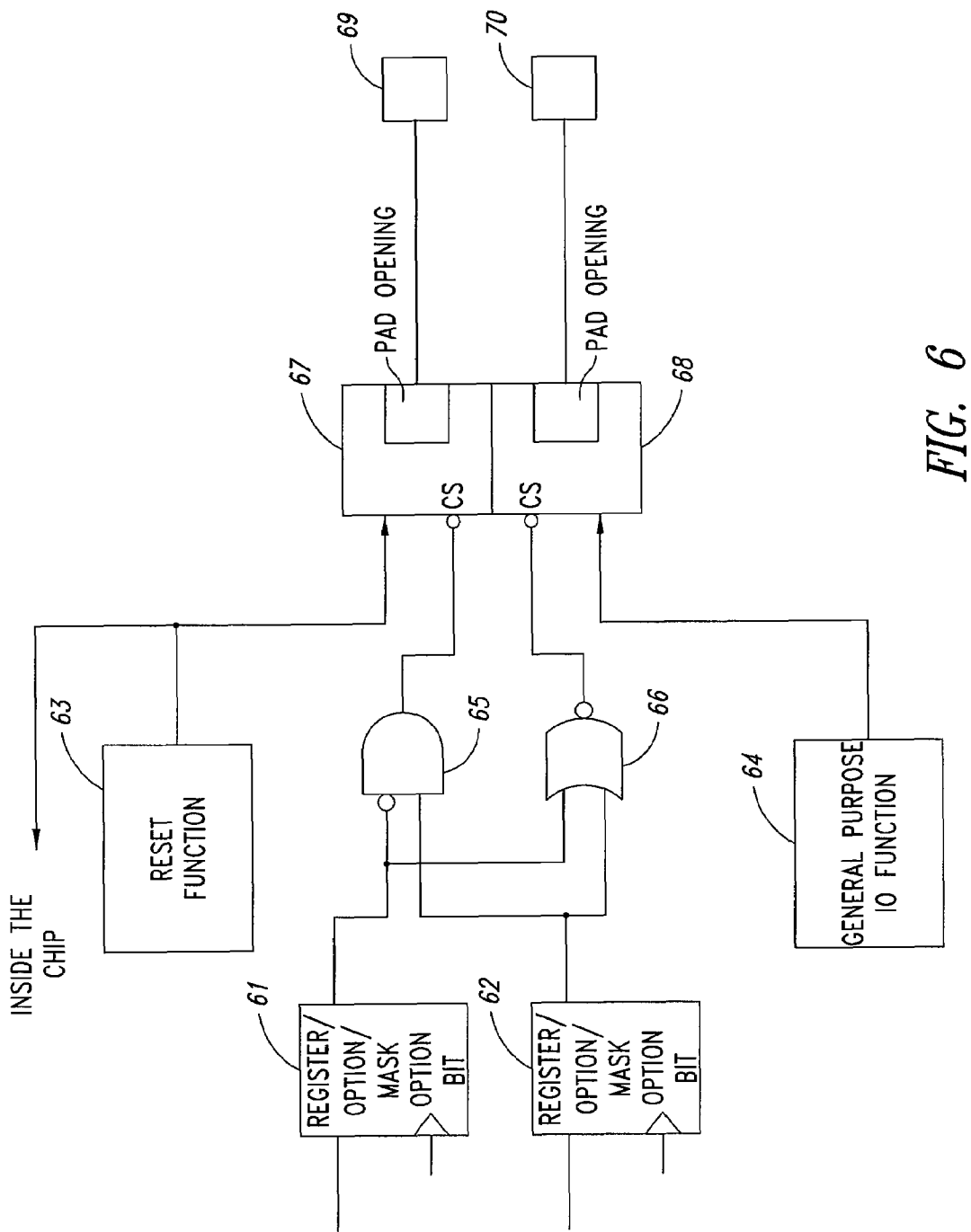

FIG. 6 shows normal pin package of the same die for two-bit implementation in accordance with one embodiment of the invention.

Figure 7:
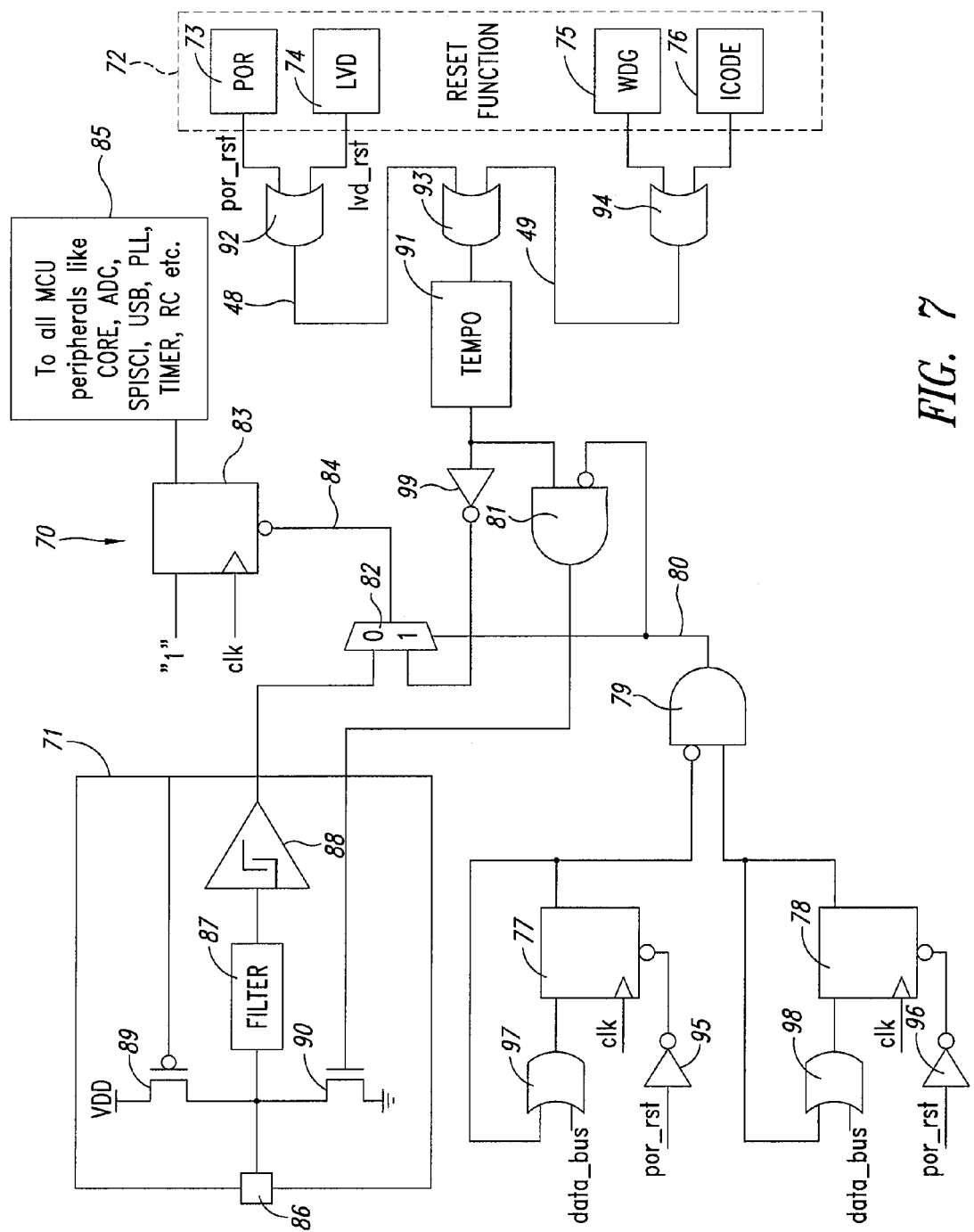

FIG. 7 shows detailed view of the interface between Reset pad and Reset function block in accordance with one embodiment of the invention.

Figure 8:
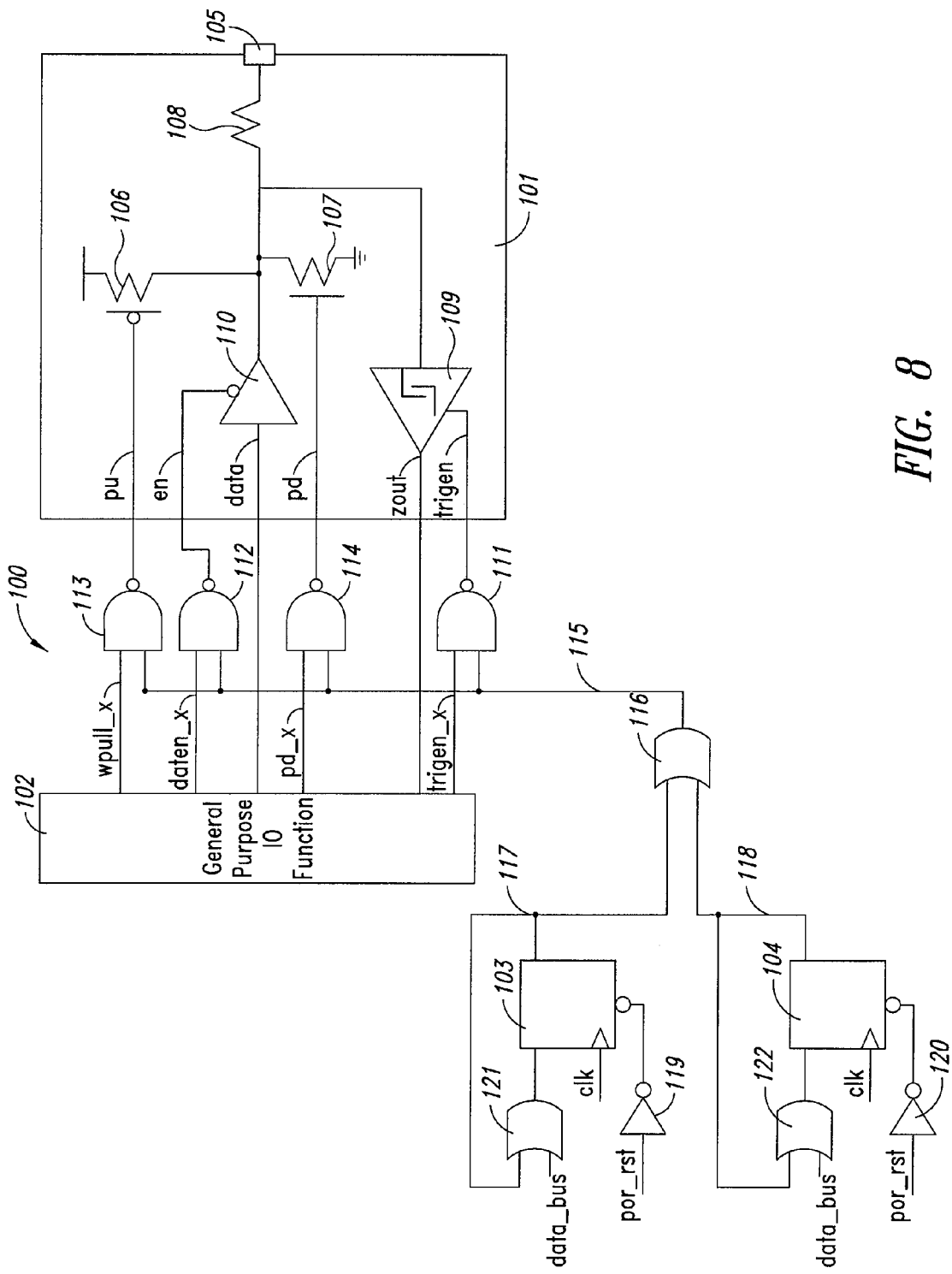

FIG. 8 shows detailed view of the interface between general-purpose IO pad and general-purpose functional block in accordance with one embodiment of the invention.

DETAILED DESCRIPTION OF THE INVENTION

In one embodiment of the present invention, in one package one external pin on which two or more functionalities can be multiplexed with the help of n configuration bits and in another package all the functions are available on different external pins. The configuration bits enable or disable the associated pad of the functional circuits instead of the functional circuit itself. So while only one pad is connected to the external pin, the output of any functional circuit can be used inside the chip for internal operation/processing. This invention stresses specifically on the availability of the die for different packages, which saves cost and time for designing different dies for different packages.

Figure 1:
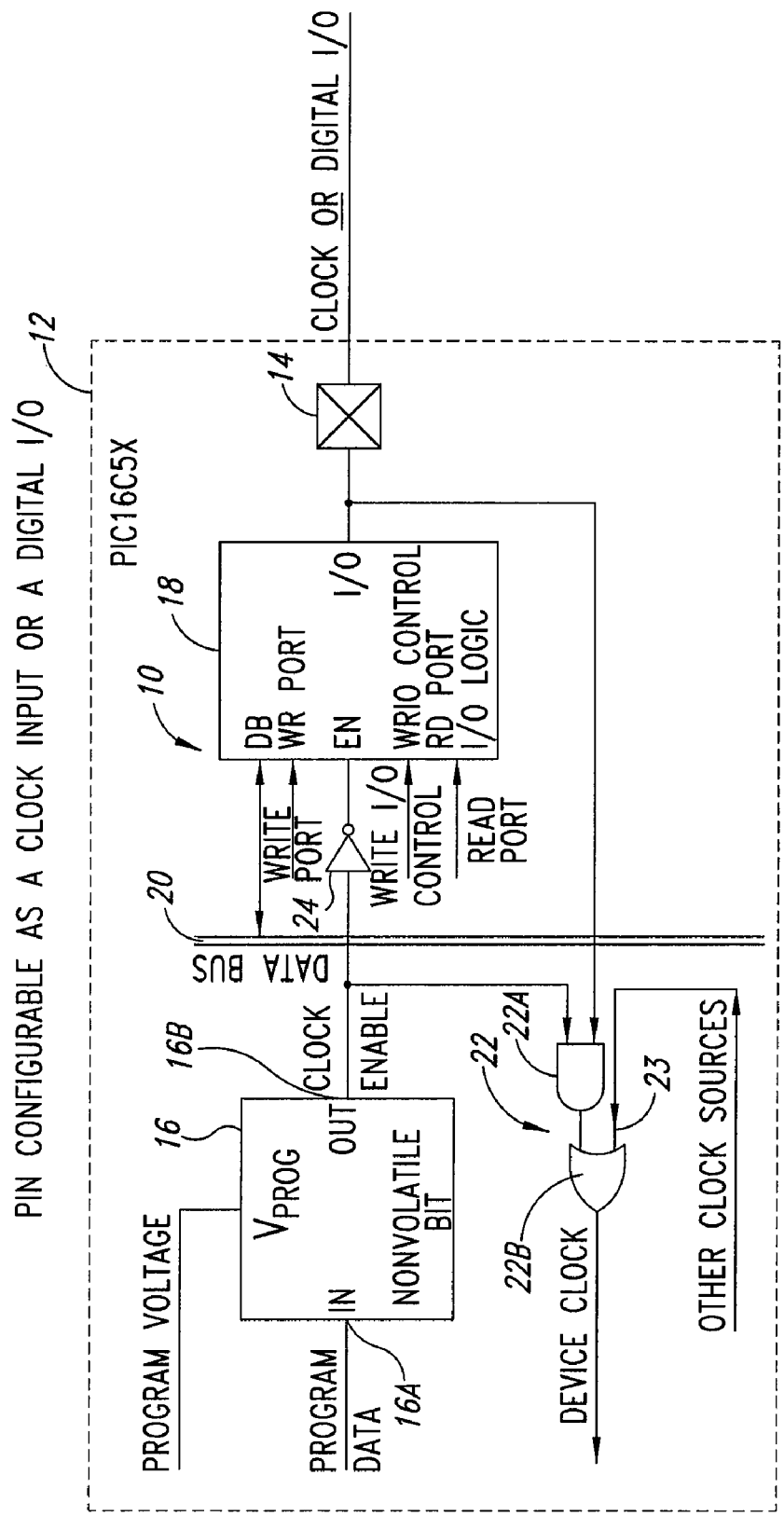
FIG. 1 shows the prior art.
Figure 2:
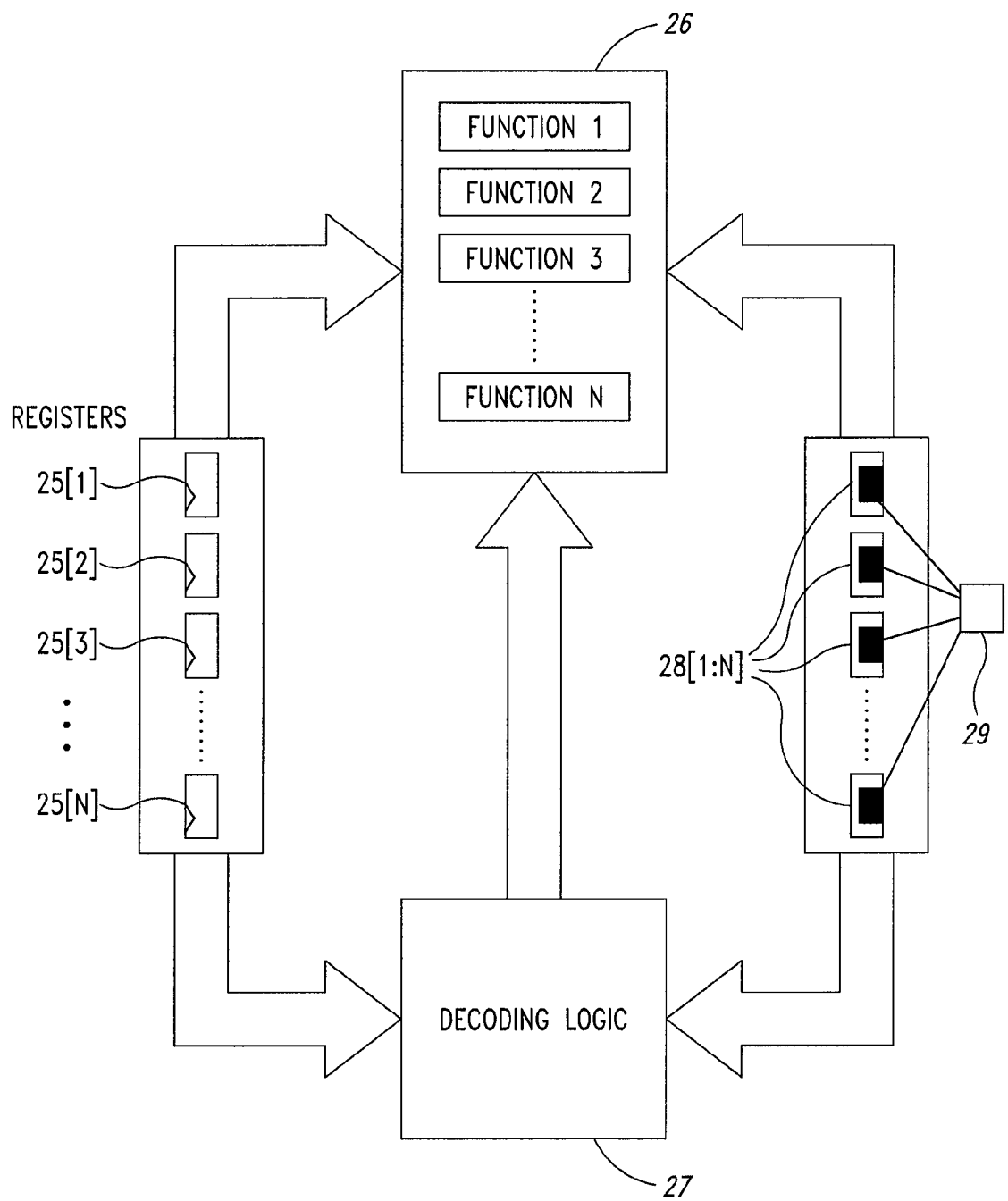
FIG. 2 shows a block diagram of one embodiment of the instant invention in optimized mode.

FIG. 2 shows the block diagram of one embodiment of the instant invention in the optimized mode. It comprises registers 25[1:N], functional block (26), decoding logic (27), pads 28[1:N] and external pin (29). In this embodiment, a number of functions contained in the functional block (26) are to be multiplexed together. Depending upon the number of functions to be multiplexed, corresponding numbers of registers 25[1:N] are configured to store corresponding bits. Thereafter depending upon bit combination, a particular pad is selected from the pads 28[1:N]. The selected pad is thus enabled to provide output to the external pin (29). Said decoding of bit combinations is done by the decoding logic (27), which is a combination of logic gates.

Figure 3:
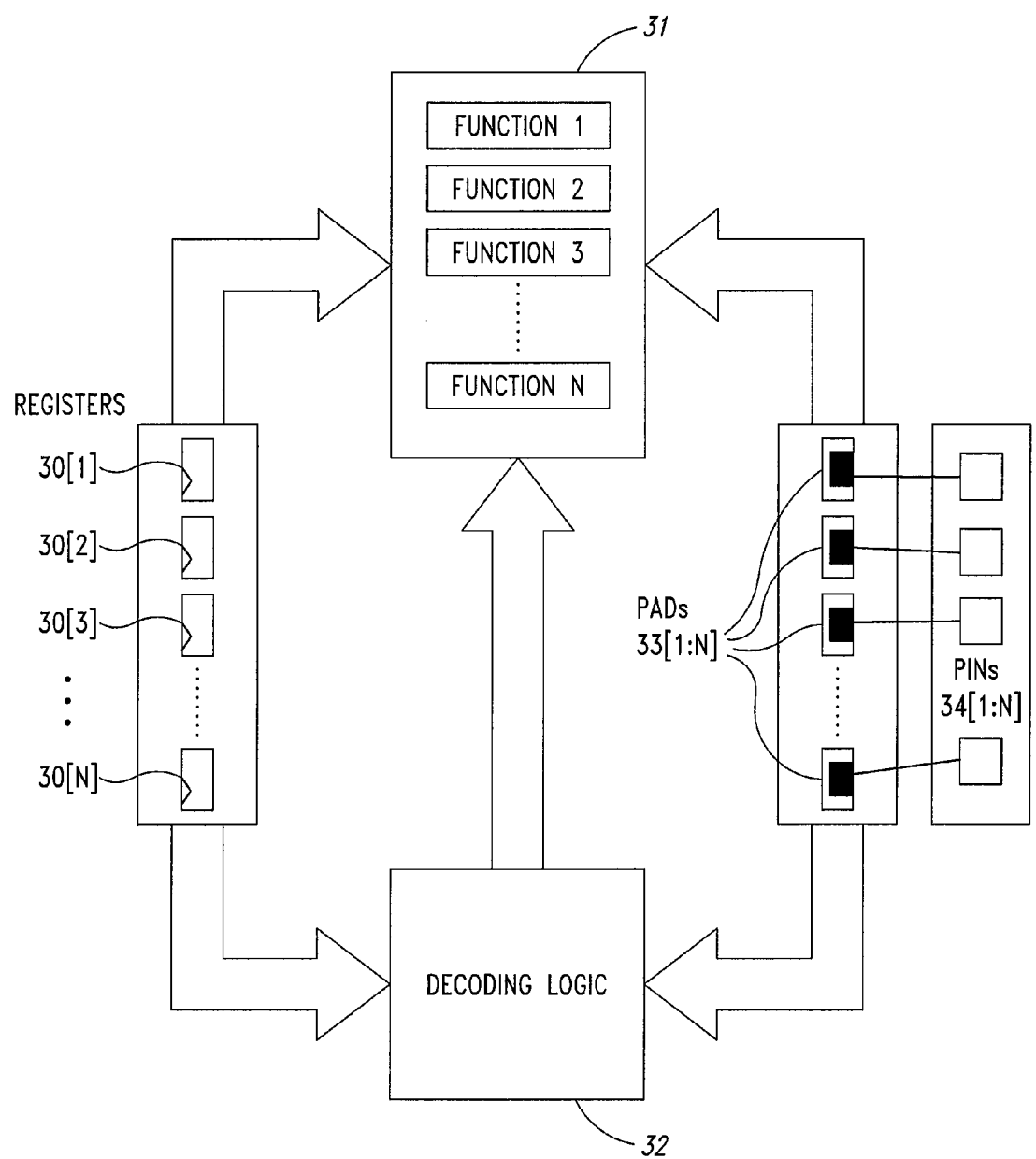
FIG. 3 shows a block diagram of one embodiment of the instant invention in normal mode.

FIG. 3 shows the block diagram of another embodiment of the instant invention in the normal mode. It comprises-registers 30[1:N], functional block (31), decoding logic (32), pads 33[1:N] and external pins 34[1:N]. In this embodiment, n number of functions can be obtained at their corresponding external pins 34[1:N] using the same die as used in the first embodiment. The numbers of registers 30[1:N] used to store bits depends upon the number of functions required at the output. The decoding logic is a combination of logic gates that decodes the bit combination. The pads 33[1:N] are selected by the decoding logic and the corresponding function is transferred to the corresponding external pin 34[1:N].

The invention will now be explained with the help of an example employing reset and general-purpose input/output pin to be multiplexed. Three configurations can be obtained for the two functionalities namely, only reset pad is enabled, only general input/output pad is enabled and both the pads are enabled, thereby employing two bits for said three configurations.

FIG. 4 shows a truth table that gives options to use a single die in said three different configurations using two bits. When BIT21 and BIT22 are "00", it shows the default state of the device at power on, selecting optimized pin package with reset pad enabled while disabling the general-purpose input/output pad at the external pin.

Similarly when BIT21 and BIT22 are "01", it shows the state of the device after the program execution starts, selecting optimized pin package with reset pad disabled while enabling general-purpose input/output pad. A unique feature is incorporated in the illustrated embodiment of the instant invention, namely if the customer wants to switch from one pin to the other pin once his work is completed, he can change the bit values. For example, after reset if customer desires to use external pin as general purpose IO pin then he should write "01" on BIT21 and BIT22. This would then enable general-purpose IO pad while disabling the reset pad.

When BIT21 and BIT22 contain "10" or "11" then the same die is used in normal pin package. This would enable two external pins i.e. one for reset pad while other for general-purpose input/output pad.

It is thus clear that when BIT21 and BIT22 are "00" or "01" optimized pin package is configured while for other bit combinations normal pin package is configured.

FIG. 5 shows the internal structure of the die using a common external pin (59).

In this figure we are focusing on optimized pin package containing two pads (57 & 58), one external pin (59) and associated circuitry containing one reset function block (55), one General Purpose function block (56) and two option registers 51, 52 that store respective mask option bits. Reset pad (57) and general purpose input output pad (58) are double bonded, i.e. bonded to same external pin (59) of the chip. Internally, reset pad is connected to reset functionality and general-purpose input/output pad is connected to any general-purpose function like Timer, UART, SPI, SCI and the like.

The respective outputs of the option registers 51, 52 are connected to the respective chip selects CS of the two pads via a combinational circuit of an AND gate (53) and an OR gate (54) respectively, which means only one pad can be selected at a time and its corresponding function is also selected which is finally connected to the external pin (59).

The advantage in doing so is that if some customer does not want to use an external reset pin then he has the flexibility to use that pin as a general purpose IO pin instead of leaving that pin unused and vice-versa in one package. Also the customer can also use both the functions in another package. Thus using the same logic with different packaging provides this functionality, thereby reducing time-to-market. In the former one, in-place of external reset, the user will use an integrated internal reset by POR (Power On Reset) and LVD (Low Voltage Detector) (as described in the latter part of the description) into the micro controller.

The default state at power-on of the circuit is the reset state as both non-volatile/memory bits are "00" (see FIG. 4) so the bits stored and output by the registers 51 and 52 are "00" which make the signals output by the logic gates 53, 54 equal to "0" and "1" respectively thereby selecting the reset pad 57. When software writes "01" in these registers 53, 54 (see FIG. 4) then it makes the output of the AND gate 53 equal to "1" and the output of the OR gate equal to "0" thereby selecting general purpose IO pad 58. This means that after start-up general-purpose input/output functionality cannot be used and only reset functionality is alive at the external pin while internal processing can still continue.

FIG. 6 shows normal pin package containing two pads (67 & 68), two pins (69 & 70) and associated circuitry containing one reset function block (63), one general-purpose function block (64) and two option registers 61, 62 that store respective mask option bits. This package is provided for users who want to use both functions simultaneously. After power on, the circuit is in the reset state, which is the default state. After application program execution, the two configuration bits in the registers 61, 62 will have either "10" or "11" written (see FIG. 4) on them making the signals output by the logic gates 65, 66 equal to "0", thereby enabling both of the pads.

FIG. 7 gives the detailed view of an interface 70 between a reset pad 71 and a reset function block 72. The reset function block 72 includes a Power On Reset block (POR) 73, a Low Voltage Detector block (LVD) 74, a Watch Dog Timer (WDG) 75, and an Illegal Opcode Block (ICODE) 76. The interface 70 includes bit registers 77, 78, and a few logic gates described below.

The Power On Reset block (POR) 73 programs the programmable device in the known state during power on to ensure proper functionality. The POR 73 asserts a reset signal por_rst when the supply voltage rises and de-asserts the signal when the supply voltage reaches to a predetermined level.

The Low Voltage Detector block (LVD) 74 ensures the correct operation of the micro-controller by providing reset signal lvd_rst when the power supply goes below a predetermined level.

The Watch Dog Timer (WDG) 75 ensures the correct execution of the application program by refreshing the watchdog timer. If there is any problem during execution then the WDG register does not gets refreshed and after certain time it generates a reset signal.

The Illegal Opcode Block (ICODE) detects if any illegal opcode is encountered during execution of the application program. If an illegal opcode is encountered, then it generates a reset signal. This is very common in micro-controller applications due to large interferences with external environment.

The bit registers 77, 78 can be programmed through software. The output of these bit registers form different configurations that are used to disable the reset pad 71 from the circuit or to connect the general-purpose IO pad (FIG. 8) or to connect both of the pads. The bits in the bit registers 77, 78 can be option bits if it is an EEPROM or FLASH device or it can be a mask option bits for the ROM device.

Different options provide flexibility to user or IC manufacturer. If these are register bits then the user/customer has the flexibility to use any of the above pads by only programming in the application program. If these are option bits or mask option bits then it provides the flexibility to IC manufacturer to reconfigure an external pin as reset pin or general-purpose IO pin and sell the device accordingly.

The bit output signals of the bit registers 77, 78 are fed as inputs to an AND gate 79. The output 80 of this gate 79 serves as one input to an AND gate 81 and also as a select signal of a MUX 82.

The interface 70 includes a flip-flop 83 with a reset pin connected to an output 84 of the MUX 82. When the output 84 of the MUX 82 is "0", it resets the flip-flop 83, which completes the circuitry of micro-controller thereby, resetting all the peripherals 85. After reset, when the system clock bit becomes "1" it de-asserts the reset of all the peripherals.

The reset pad 71 contains a pad 86 connected to the external pin of the chip as shown in FIGS. 5 and 6. An external reset (with low reset state), received from the pad 86, is applied to a filter 87. The function of the filter 87 is to remove glitches on the reset coming from external sources so as to remove spurious reset or false reset. It has some fixed time window below which it will not detect any change on its input. The output of the filter 87 goes to a Schmitt trigger 88 and the output of this Schmitt trigger goes to the MUX 82 as one of its inputs. Reset pad 71 also contains a pull up PMOS transistor 89 that provides a weak pull up to the reset signal if the reset pin is unused from the external environment to avoid false reset. Also it contains an NMOS pull down transistor 90 of which gate is connected to the output of the AND gate 81 and thus creates the reset loop circuitry.

Before discussing the reset loop it is pertinent to mention that the interface 70 includes a TEMPO block 91 that provides a fixed temporization delay (or stretches) to the reset signal coming from any of the POR, LVD, WDG, and ICODE blocks so as to provide stabilization to the internal/external oscillator circuitry.

Reset loop circuitry traverses the path from POR, LVD, WDG, and ICODE through OR gates 92, 93, 94 to the TEMPO block 91, AND gate 81, and the gate of the pull-down transistor 90.

The interface 70 also includes inverters 95, 96 connected respectively between the POR 73 and the bit registers 77, 78; OR gates 97, 98 connected respectively between the output and data input of the bit registers 77, 78; and an inverter 99 connected between the TEMPO 91 and the MUX 82.

FIG. 8 provides a detailed view of an interface 100 between a general-purpose IO pad 101 and a general-purpose functional block 102. The interface 100 includes bit registers 103, 104 storing configuration bits. The pad 101 contains a pin 105 bonded to the external pin of the chip (as shown in FIGS. 5 and 6), a pull up resistor 106, a pull down resistor 107, a limiting resistor 108, a Schmitt trigger 109, and a tri-state buffer 110. The input of Schmitt trigger 109 is received from the pin 105, which has an enable signal "trigen" coming from the general-purpose functional block 102 via an AND gate 111, and an output "zout" connected to the general-purpose functional block. The input of the tristate buffer 110 is a "data" signal while it receives an enable signal "en" from the general-purpose functional block 102 via a NAND gate 112 and outputs the data signal to the pin 105. Other signals "pu" and "pd" are respective outputs of a NAND gate 113 and an AND gate 114 connected to the general-purpose functional block 102. The gates 111-114 each have one input coming from the output 115 of an OR gate 116. The inputs of the OR gate 116 are signals 117, 118 coming from the bit registers 103, 104. The output of the OR gate 116 is used to enable or disable the gates that in turn enable or disable the complete pad 101.

The interface 100 also includes inverters 119,120 connected respectively between the POR 73 and the bit registers 103, 104; and OR gates 121, 122 connected respectively between the output and data input of the bit registers 103, 104.

Operation of the Circuit:
Case 1: With Optimized Pin Package
Scenario 1: Reset Pad 71 in Picture As soon as the chip is powered on, POR 73 generates a reset on signal line "por_rst". This "por_rst" is connected to the resets of the bit registers 77, 78, so it resets those registers, which is their default state. The outputs of these bit registers 77, 78 act as input to the AND gate 79. The output 80 of the AND gate 79 is connected to the select signal of the MUX 82 and to the input of the AND gate 81. During reset both of the outputs of the bit registers 77, 78 are "0" therefore signal 80 is "0". The MUX 82 passes the signal coming from the pin 86 of the reset pad 71 to reset the register 83, which in turn provides a reset to all the peripherals 85.

In the default state, the reset pad 71 is in function and at the same time the bit registers 103, 104 of FIG. 8 output "00" which makes signal 115 equal to "0" which disables all the gates at the input of IO pad 101, thus disables the IO pad from the picture.

Also, the reset generated by POR 73 during power on travels through the OR gates 92, 93, thereafter through the TEMPO 91 and the AND gate 81 (enabled by signal 80 from the AND gate 79) to the gate of the pull down transistor 90 which pulls down the pin 86 thereby providing reset to external peripherals. Similarly it goes through the filter 87, the Schmitt trigger 88, the MUX 82, and the flip-flop 83, thereby resetting all the peripherals 85 and completing the reset loop.

Let us now consider the reset being generated by any of the LVD 74, WDG 75, or ICODE 76 blocks. The signal so generated travels through one of the OR gates 92, 94, OR gate 93, and TEMPO 91, thereafter to the AND gate 81, transistor 90, and pin 86 to outside as well as inside the chip through the filter 87, Schmitt trigger 88, and MUX 82 to the flip-flop 83, thereby completing the reset loop.

Scenario 2: General Purpose IO Pad 101 in Picture

As soon as the chip is powered on, POR 73 will generate the reset signal "por_rst" which resets the bit registers 77, 78 giving "00" from the bit registers, thereby making 80 equal to "0". Meanwhile reset pad 71 is connected to the external pad, which is the default state. Once the whole VDD power range is achieved after the temporization time and mode setting in the micro-controller, an application program is executed. The bits "01" are written in the bit registers 77, 78 respectively after execution of the application program.

This bestows a value "0" from the bit register 77 and "1" from the bit register 78, making signal 80 equal to "1" which disables the AND gate 81 and also selects other input at the MUX 82 coming from the TEMPO block 91 through inverter 99. Due to this, the reset pad 71 is completely cut-off from the circuit. Simultaneously, signal 115 (see FIG. 8) which contains a value "1" is applied to the inputs of AND 111, NAND 112, NAND 113, and AND 114 gates thereby, enabling these gates and connecting the general-purpose function block to the general purpose IO pad 101.

Both the configuration bits are write-only so as to avoid any accidental resetting of the bit, which might result in resetting of the device while the application is running.

Now consider the case when one of LVD 74 (during power down), WDG 75, or ICODE 76 (illegal opcode) blocks generates a reset. The signal will loop through OR gate 92 or OR gate 94 and OR gate 93, TEMPO 91, inverter 99, and MUX 82 to the flip-flop 83, which resets all the peripherals. The device will remain operational in this mode until next power down.

Finally to completely reset the chip and to come back to its default state, another POR reset should come which will reset the complete thing and the device would come to its default state.

Case 2: With Normal Pin Package (FIG. 6)

The two bit registers 61, 62 are programmed with any combination of "10" or "11" that makes each of the signals output by the gates 65, 66 equal to "0" thereby enabling both the pads 67, 68 connected to the external pins 69, 70. Thus in this package both reset and general-purpose functions are available at the same time.

The invention is capable of considerable modification, alternation and equivalents in form and function, as will occur to those ordinarily skilled in the pertinent arts. While the invention is described as having application to microcontroller, it is intended to have application to other integrated circuits, including, but not limited to, any microprocessor.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A system for multiplexing an integrated circuit pin, comprising:
   a plurality of registers for storing bit values;
   a plurality of functions to be multiplexed on receiving said bit values;
   a decoding logic for decoding said bit values for selecting one of the functions;
   a plurality of pads connected to said plurality of functions and said decoding logic; and
   one or more external pins acting as inputs/outputs for said selected function depending upon said bit values.

2. A system for multiplexing an integrated circuit pin as claimed in claim 1 wherein the number of said plurality of registers used depends upon said number of functions to be multiplexed.

3. A system for multiplexing an integrated circuit pin as claimed in claim 1 wherein said bit values used include hardware or software programmed bits.

4. A system for multiplexing an integrated circuit pin as claimed in claim 1 wherein said plurality of functions exclude Vcc and ground pins of said integrated circuit.

5. A system for multiplexing an integrated circuit pin as claimed in claim 1 wherein said decoding logic is a combination of logic gates depending upon the number of said functions to enable the pads and functions.

6. A system for multiplexing an integrated circuit pin as claimed in claim 1 wherein said one or more external pins selection depends upon optimized pin package or normal pin package.

7. A system for multiplexing an integrated circuit pin as claimed in claim 1 wherein the decoding logic includes:
   a logic circuit connected to said pads comprising logic gates and registers for performing said functions;
   at least two registers connected to said logic circuit to enable/disable said pad;
   plurality of logic gates connected to said registers; and
   an AND gate receiving inputs from said registers for providing a signal to said logic circuit to make said one or more external pins act as inputs/outputs.

8. A method for multiplexing a pin of an integrated circuit, the method comprising the steps of:
   storing bit values in a plurality of registers;
   decoding said bit values for selecting at least one of a plurality of functions;
   connecting a plurality of pads to said plurality of functions and said decoding logic; and
   enabling or disabling said pads depending upon said bit values.

9. The method of claim 8 wherein the plurality of pads includes a reset pad and an I/O pad and the enabling or disabling step includes enabling the reset pad and disabling the I/O pad during a power up phase.

10. The method of claim 9 wherein the enabling or disabling steps includes disabling the reset pad and enabling the I/O pad during an application phase subsequent to the power up phase.

11. A multiplexing device, comprising;
   a plurality of pads;
   a plurality of bit registers storing bit values;
   a plurality of functional units respectively connected to the pads, each of the functional units be structured to provide a respective one of a plurality of functions to the corresponding output pad;
   decoding logic coupled to the bit registers and structured to enable or disable the connection between each functional unit and the corresponding pad depending on the bit values stored in the bit registers; and
   an external pin connected to at least two of the pads, the decoding logic enabling only one of the at least two pads to provide to the external pin the function of the functional unit corresponding to the only one of the at least two pads.

12. The device of claim 11 wherein said bit values used include software programmed bits.

13. The device of claim 11 wherein said decoding logic is a combination of logic gates depending upon the number of said functions to enable the pads and functions.

14. The device of claim 11 wherein said decoding logic is structured to selected pins of said plurality of external pins selection depending upon an optimized pin package or a normal pin package.

15. The device of claim 11 wherein the decoding logic includes:
   a logic circuit connected to said pads comprising logic gates for performing said functions;
   plurality of logic gates connected to said bit registers; and
   an AND gate receiving inputs from said bit registers for providing a signal to said logic circuit to make said plurality of external pins act as inputs/outputs.

16. A multiplexing device, comprising;
   a plurality of pads;
   a plurality of bit registers storing bit values;
   a plurality of functional units respectively connected to the pads, each of the functional units be structured to provide a respective one of a plurality of functions to the corresponding output pad;
   decoding logic coupled to the bit registers and structured to enable or disable the functional unit and the corresponding pad depending bit values stored in the bit registers; and
   a plurality of external pins connected respectively to the pads, the decoding logic enabling the pads to provide to the external pins the functions of the functional units corresponding to the pads.

17. The device of claim 16 wherein said bit values used include software programmed bits.

18. The device of claim 16 wherein said decoding logic is a combination of logic gates depending upon the number of said functions to enable the pads and functions.

19. The device of claim 16 wherein said decoding logic is structured to selected pins of said plurality of external pins selection depending upon an optimized pin package or a normal pin package.

20. The device of claim 16 wherein the decoding logic includes:
   a logic circuit connected to said pads comprising logic gates for performing said functions;
   plurality of logic gates connected to said bit registers; and
   an AND gate receiving inputs from said bit registers for providing a signal to said logic circuit to make said plurality of external pins act as inputs/outputs.

* * * * *

UNITED STATES PATENT AND TRADEMARK OFFICE
CERTIFICATE OF CORRECTION

PATENT NO. : 7,285,980 B2  Page 1 of 1
APPLICATION NO. : 11/190492
DATED : October 23, 2007
INVENTOR(S) : Bansal et al.

It is certified that error appears in the above-identified patent and that said Letters Patent is hereby corrected as shown below:

Column 10
Lines 37-40, "decoding logic coupled to the bit registers and structured to enable or disable the functional unit and the corresponding pad depending bit values stored in the bit registers; and" should read as -- decoding logic coupled to the bit registers and structured to enable or disable the connection between each functional unit and the corresponding pad depending on the bit values stored in the bit registers; and --

Signed and Sealed this

Twenty-seventh Day of May, 2008

JON W. DUDAS
*Director of the United States Patent and Trademark Office*